United States Patent
Kawasaki et al.

(10) Patent No.: US 10,510,725 B2
(45) Date of Patent: Dec. 17, 2019

(54) SEMICONDUCTOR DEVICE

(71) Applicant: Toshiba Memory Corporation, Minato-ku (JP)

(72) Inventors: Kazushige Kawasaki, Yokohama (JP); Yoichiro Kurita, Minato (JP)

(73) Assignee: Toshiba Memory Corporation, Minato-ku (JP)

( * ) Notice: Subject to any disclaimer, the term of this patent is extended or adjusted under 35 U.S.C. 154(b) by 10 days.

(21) Appl. No.: 15/919,514

(22) Filed: Mar. 13, 2018

(65) Prior Publication Data

US 2019/0088625 A1 Mar. 21, 2019

(30) Foreign Application Priority Data

Sep. 15, 2017 (JP) .................. 2017-178301

(51) Int. Cl.
| | | |
|---|---|---|
| H01L 25/065 | (2006.01) | |
| G11C 11/34 | (2006.01) | |
| H01L 21/78 | (2006.01) | |
| H01L 23/00 | (2006.01) | |

(52) U.S. Cl.
CPC .......... *H01L 25/0657* (2013.01); *G11C 11/34* (2013.01); *H01L 21/78* (2013.01); *H01L 24/81* (2013.01); *H01L 2224/16145* (2013.01); *H01L 2224/48221* (2013.01); *H01L 2225/06513* (2013.01); *H01L 2225/06555* (2013.01);
(Continued)

(58) Field of Classification Search
CPC ....... H01L 25/0657; G11C 11/34; G11C 5/04; G11C 5/06
See application file for complete search history.

(56) References Cited

U.S. PATENT DOCUMENTS

| | | | |
|---|---|---|---|
| 7,119,428 B2 | 10/2006 | Tanie et al. | |
| 8,546,955 B1* | 10/2013 | Wu | ..................... H01L 23/5384 |
| | | | 257/686 |
| 9,299,689 B2* | 3/2016 | Oh | ........................ H01L 21/561 |

(Continued)

FOREIGN PATENT DOCUMENTS

| | | |
|---|---|---|
| JP | 4237207 | 3/2009 |
| JP | 2011-243724 | 12/2011 |

(Continued)

*Primary Examiner* — Victoria K. Hall
(74) *Attorney, Agent, or Firm* — Oblon, McClelland, Maier & Neustadt, L.L.P.

(57) ABSTRACT

A semiconductor device includes a base member having a first surface and a second surface on a side opposite to the first surface, the base member including at least one interconnect extending in a first direction along the first surface; two or more stacked bodies arranged in the first direction on the first surface, each of the two or more stacked bodies including semiconductor chips stacked in a second direction perpendicular to the first surface; and logic chips electrically connected respectively to the stacked bodies. Each of semiconductor chips includes first and second semiconductor layers. The first and second semiconductor layers each have an element surface and a back surface. An active element is provided on the element surface. The first semiconductor layer and the second semiconductor layer are bonded such that the element surface of the second semiconductor layer faces the element surface of the first semiconductor layer.

16 Claims, 9 Drawing Sheets

(52) U.S. Cl.
 CPC ............... *H01L 2924/1431* (2013.01); *H01L 2924/1434* (2013.01)

(56) References Cited

U.S. PATENT DOCUMENTS

| | | | | |
|---|---|---|---|---|
| 9,379,074 | B2* | 6/2016 | Uzoh | H01L 24/10 |
| 9,941,253 | B1* | 4/2018 | Jung | H01L 25/50 |
| 10,128,223 | B2* | 11/2018 | Kawasaki | H01L 25/18 |
| 2006/0192277 | A1* | 8/2006 | RaghuRam | H01L 23/49816 257/686 |
| 2006/0262587 | A1* | 11/2006 | Matsui | G11C 5/00 365/63 |
| 2007/0126085 | A1* | 6/2007 | Kawano | H01L 21/76898 257/621 |
| 2008/0009124 | A1 | 1/2008 | Ishino et al. | |
| 2008/0079163 | A1 | 4/2008 | Kurita et al. | |
| 2009/0189293 | A1 | 7/2009 | Suzuki et al. | |
| 2010/0171213 | A1* | 7/2010 | Hisano | H01L 23/3128 257/714 |
| 2011/0089573 | A1 | 4/2011 | Kurita | |
| 2012/0061842 | A1* | 3/2012 | Kim | H01L 23/16 257/769 |
| 2013/0256836 | A1* | 10/2013 | Hsiao | H01L 23/647 257/532 |
| 2014/0014958 | A1* | 1/2014 | Oh | H01L 22/00 257/48 |
| 2014/0103516 | A1* | 4/2014 | Yeom | H01L 23/481 257/685 |
| 2014/0246781 | A1* | 9/2014 | Hosomi | H01L 25/03 257/774 |
| 2014/0252632 | A1* | 9/2014 | Barth | H01L 23/5384 257/773 |
| 2014/0361410 | A1* | 12/2014 | Yamamichi | H01L 23/49838 257/621 |
| 2014/0376295 | A1* | 12/2014 | Oh | G11C 29/52 365/51 |
| 2015/0010269 | A1* | 1/2015 | Jo | G02B 6/43 385/14 |
| 2015/0035135 | A1* | 2/2015 | Hung | H01L 23/3672 257/712 |
| 2015/0069596 | A1 | 3/2015 | Kawasaki et al. | |
| 2015/0108628 | A1* | 4/2015 | Yu | H01L 23/42 257/712 |
| 2015/0113195 | A1* | 4/2015 | Kim | G06F 13/4027 710/308 |
| 2015/0179617 | A1* | 6/2015 | Lin | H01L 25/0657 257/713 |
| 2015/0262877 | A1* | 9/2015 | Kurita | H01L 25/18 257/737 |
| 2015/0262904 | A1* | 9/2015 | Hung | H01L 23/367 257/713 |
| 2015/0262974 | A1* | 9/2015 | Koshiishi | H01L 23/3128 257/48 |
| 2015/0262989 | A1* | 9/2015 | Kawasaki | H01L 25/18 257/737 |
| 2016/0079184 | A1 | 3/2016 | Tsukiyama et al. | |
| 2016/0268232 | A1* | 9/2016 | Kurita | H01L 23/49827 |
| 2016/0351492 | A1* | 12/2016 | Watanabe | H01L 24/05 |
| 2017/0012031 | A1* | 1/2017 | Lim | H01L 25/18 |
| 2017/0250171 | A1* | 8/2017 | Yu | H01L 25/50 |
| 2017/0309600 | A1* | 10/2017 | Jung | H01L 25/0655 |
| 2018/0197837 | A1* | 7/2018 | Yu | H01L 25/0652 |
| 2018/0286835 | A1* | 10/2018 | Nah | H01L 21/6835 |
| 2019/0051634 | A1* | 2/2019 | Park | H01L 25/043 |
| 2019/0088619 | A1* | 3/2019 | Kurita | H01L 24/97 |
| 2019/0088634 | A1* | 3/2019 | Tsukiyama | H01L 24/20 |

FOREIGN PATENT DOCUMENTS

| | | |
|---|---|---|
| JP | 5696797 | 4/2015 |
| JP | 2015-176958 | 10/2015 |
| TW | 201511213 A | 3/2015 |
| TW | 201535592 A | 9/2015 |
| TW | 201613050 A | 4/2016 |
| TW | 201633412 A | 9/2016 |

* cited by examiner

SEMICONDUCTOR DEVICE

CROSS-REFERENCE TO RELATED APPLICATIONS

This application is based upon and claims the benefit of priority from Japanese Patent Application No. 2017-178301, filed on Sep. 15, 2017; the entire contents of which are incorporated herein by reference.

FIELD

Embodiments generally relate to a semiconductor device.

BACKGROUND

There is a semiconductor device in which multiple semiconductor chips are stacked and resin-sealed. The manufacturing yield of such a semiconductor device is dependent on mainly the yield of the stacked body including the multiple semiconductor chips. For example, the size of each semiconductor chip increases as the circuit scale is enlarged and/or the memory capacity of the semiconductor memory device is enlarged. Accordingly, the probability of a structural defect being included in each semiconductor chip increases; and the manufacturing yield decreases. Therefore, the yield of the stacked body including the multiple semiconductor chips may decrease greatly; and the manufacturing cost of the semiconductor device may increase.

DETAILED DESCRIPTION

Figure 1:
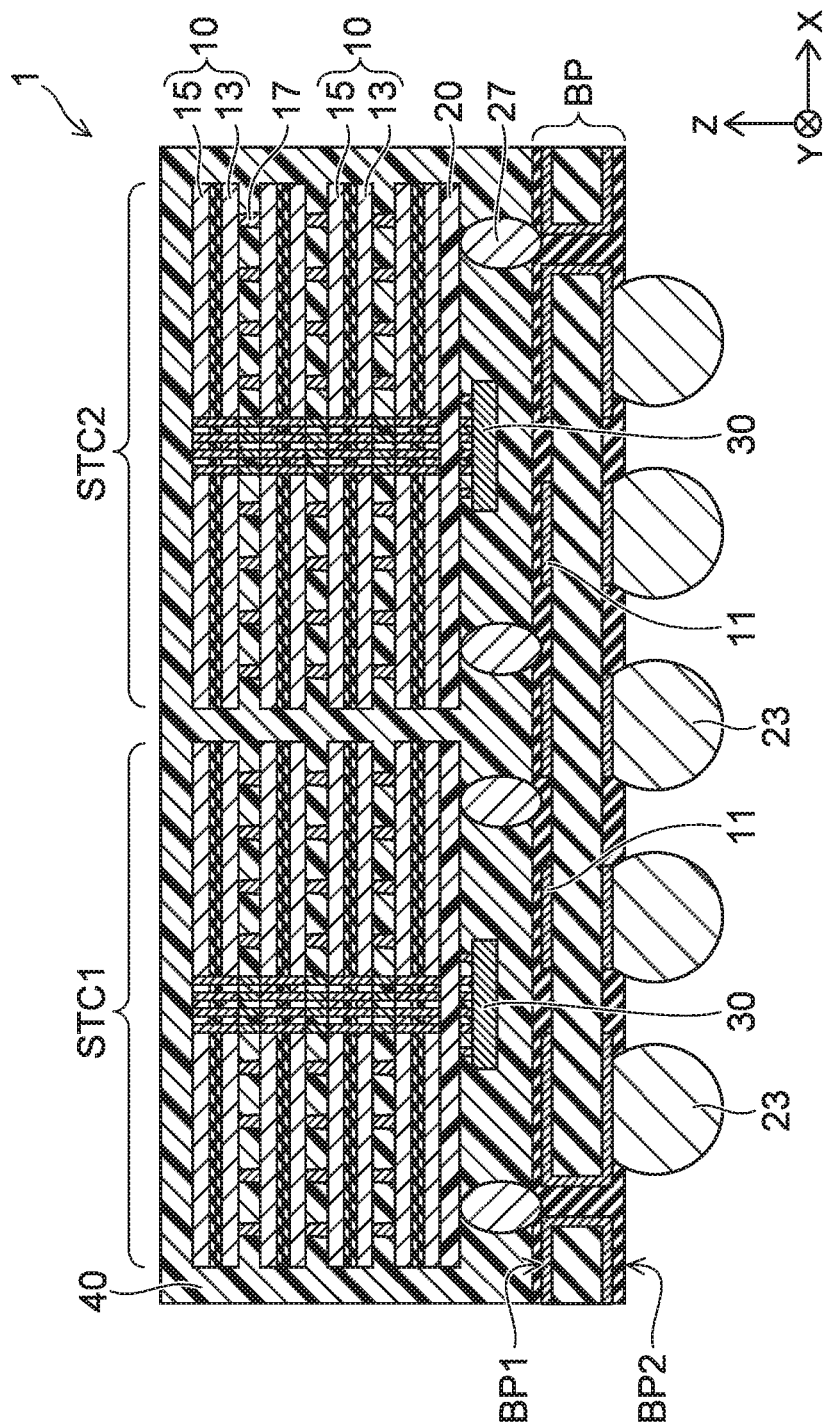
FIG. 1 is a schematic cross-sectional view showing a semiconductor device according to a first embodiment.

According to one embodiment, a semiconductor device includes a base member having a first surface and a second surface, the second surface being on a side opposite to the first surface, the base member including at least one interconnect extending in a first direction along the first surface; two or more stacked bodies arranged in the first direction on the first surface, each of the two or more stacked bodies including a plurality of semiconductor chips stacked in a second direction perpendicular to the first surface; and two or more logic chips electrically connected respectively to the stacked bodies. Each of the plurality of semiconductor chips includes a first semiconductor layer and a second semiconductor layer. The first semiconductor layer and the second semiconductor layer each have an element surface and a back surface. An active element is provided on the element surface. The back surface is on a side opposite to the element surface. The first semiconductor layer and the second semiconductor layer are bonded such that the element surface of the second semiconductor layer faces the element surface of the first semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment. The semiconductor device 1 includes a base member BP, a stacked body STC1, and a stacked body STC2. The stacked bodies STC1 and STC2 each include multiple semiconductor chips 10.

The member BP is, for example, a mounting substrate and has a first surface BP1 and a second surface BP2. The second surface BP2 is the surface on the opposite side of the first surface BP1. The base member BP includes at least one interconnect 11 extending in an X-direction or a Y-direction along the first surface BP1. The base member BP may be a so-called interposer that includes multiple interconnect layers provided with an inter-layer insulating film interposed.

A BGA (Ball Grid Array) that includes multiple solder balls 23 is provided on the second surface BP2 of the base member BP. The solder balls 23 are electrically connected respectively to interconnects 11 provided at the first surface BP1. In the case where the semiconductor device 1 is mounted on a not-illustrated circuit board, the solder balls 23 electrically connect the interconnects 11 to an external circuit (not illustrated).

For example, the stacked bodies STC1 and STC2 are arranged in the X-direction on the first surface BP1. The stacked bodies STC1 and STC2 each include the multiple semiconductor chips 10 stacked in the Z-direction. The semiconductor chip 10 includes a semiconductor layer 13 and a semiconductor layer 15. The semiconductor layer 13 and the semiconductor layer 15 each have an element surface on which an active element is provided and a back surface on the opposite side of the element surface. The semiconductor layer 13 and the semiconductor layer 15 are bonded so that an element surface 15A of the semiconductor layer 15 faces an element surface 13A of the semiconductor layer 13 (referring to FIG. 2).

The semiconductor device 1 further includes logic chips 30 electrically connected respectively to the stacked bodies STC1 and STC2.

As shown in FIG. 1, the semiconductor chips 10 are stacked on a wiring board 20 with connection bumps 17 interposed. The logic chips 30 are disposed on the backside of the wiring board 20. The wiring board 20 has a top surface including an interconnect (not illustrated) connected to the semiconductor chips 10, and a back surface where the logic chips 30 and flip chip bumps (hereinbelow, FC bumps 27) are disposed.

For example, a logic chip 30 is electrically connected to one of the stacked bodies STC1 and STC2 by via contacts extending through the wiring board 20. The FC bumps 27 are connected to the interconnects 11 provided at the first surface BP1 of the base member BP. For example, the FC bumps 27 electrically connect the logic chip 30 and the interconnects 11 via the interconnect (not illustrated) provided at the top surface of the wiring board 20. Also, other FC bumps 27 electrically connect the other of the stacked body STC1 or STC2 and interconnects 11 via interconnects (not illustrated) provided at the top surface of another wiring board 20.

For example, the stacked bodies STC1 and STC2 and the logic chips 30 are sealed airtightly on the base member BP by using a sealing resin 40.

In the embodiment, the manufacturing yield of the semiconductor device 1 can be increased by disposing the two stacked bodies STC1 and STC2 on the base member BP, compared to a case where one stacked body having larger size is provided on the base member BP.

For example, in the case where the semiconductor device 1 is a semiconductor memory device, the semiconductor chips 10 each are memory chips; and the stacked bodies STC1 and STC2 each function as a memory stack in which multiple memory chips are stacked. The semiconductor device 1 has the total memory capacity of the combination of the memory capacity of the stacked body STC1 and the memory capacity of the stacked body STC2. In the semiconductor device 1, the size of the memory chip can be halved compared to the case where the same memory capacity is realized using one memory stack.

The yield of the memory chip is greatly dependent on the chip size. For example, among multiple memory chips formed on a silicon wafer, the memory chips that include a structural defect in the interior of the memory chip are defective; and the memory chips not including a structural defect are good parts. For example, the structural defects in the silicon wafer are not distributed uniformly and have a distribution that is dependent on some factor. Therefore, the yield of the memory chip can be improved further by reducing the chip size. As a result, the yield of the memory stack is improved markedly by reducing the size of the memory chip.

Figure 2:
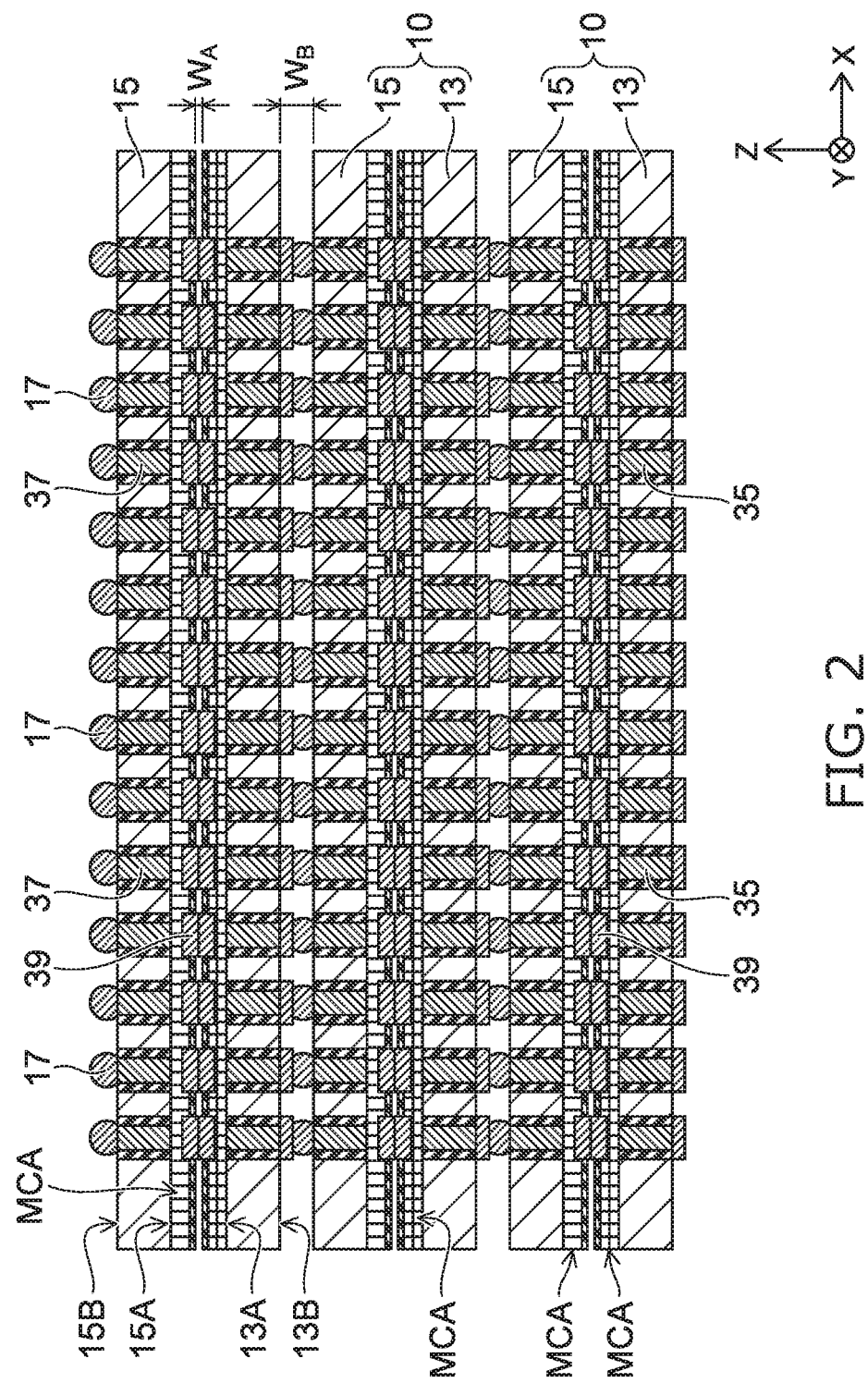
FIG. 2 is a schematic cross-sectional view showing a stacked structure of semiconductor chips.

FIG. 2 is a schematic cross-sectional view showing the stacked structure of the semiconductor chips 10. As shown in FIG. 2, the semiconductor chip 10 has a structure in which the semiconductor layer 13 and the semiconductor layer 15 are bonded. For example, the semiconductor layers 13 and 15 are formed by reducing the thicknesses by grinding or polishing semiconductor substrates.

The semiconductor layer 13 has the element surface 13A and a back surface 13B; and the semiconductor layer 15 has the element surface 15A and a back surface 15B. For example, a memory cell array MCA that includes three-dimensionally arranged memory cells is provided on the element surface 13A and on the element surface 15A. Via contacts 35 that reach the memory cell array MCA from the back surface 13B are provided in the semiconductor layer 13; and via contacts 37 that reach the memory cell array MCA from the back surface 15B are provided in the semiconductor layer 15. The via contacts 35 and 37 are connected respectively to contact pads (not illustrated) of the memory cell array MCA.

The semiconductor layers 13 and 15 are bonded so that the element surface 13A and the element surface 15A face each other. The semiconductor layers 13 and 15 are electrically connected to each other by contact pads 39 provided at the surfaces of the memory cell arrays MCA.

The multiple semiconductor chips 10 are stacked in the Z-direction. The semiconductor chips 10 that are adjacent to each other in the Z-direction are connected via the connection bump 17 that links one via contact 35 to another via contact 37.

For example, for the semiconductor chips 10, a spacing $W_A$ between the memory cell array MCA that is provided on the element surface 13A and the memory cell array MCA that is provided on the element surface 15A is narrower than a spacing $W_B$ between the back surface 13B and the back surface 15B of the semiconductor chips 10 adjacent to each other in the Z-direction. The spacing $W_A$ is zero in the case where the bonding is performed so that the memory cell array MCA on the element surface 13A and the memory cell array MCA on the element surface 15A contact each other.

Figure 3:
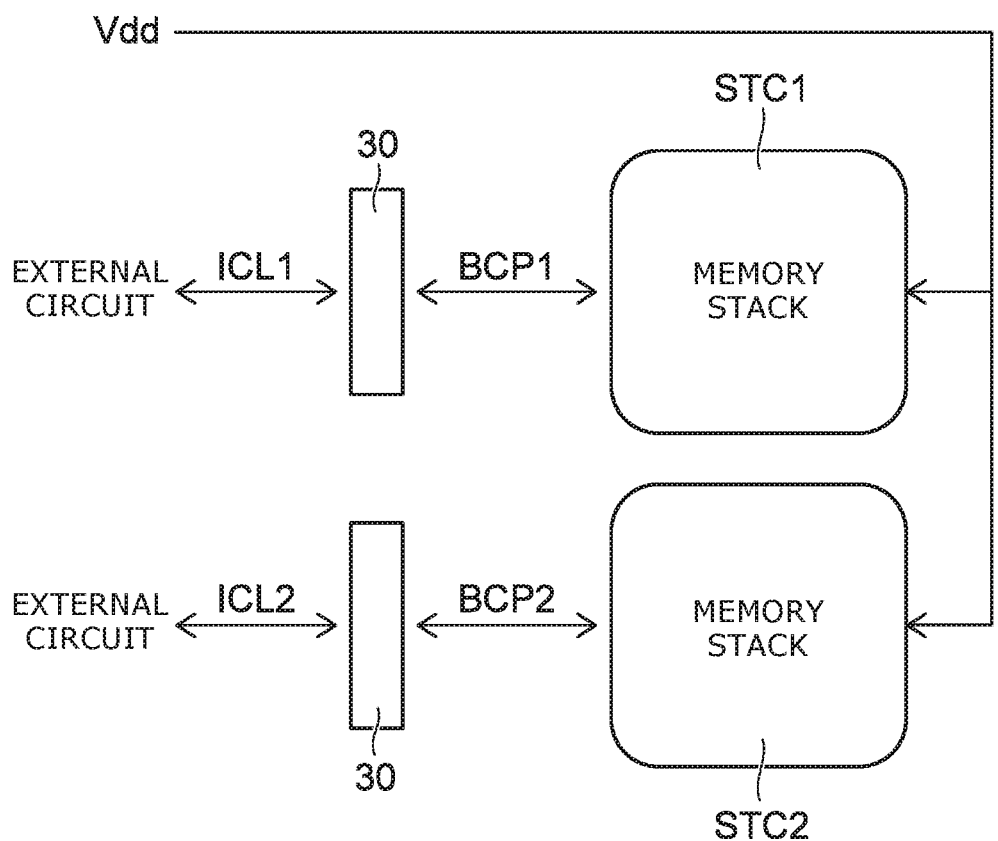
FIG. 3 is a schematic view showing a configuration of the semiconductor device according to the first embodiment.

FIG. 3 is a schematic view showing the configuration of the semiconductor device 1 according to the first embodiment. The semiconductor device 1 is, for example, a semiconductor memory device and includes the stacked bodies STC1 and STC2 functioning as memory stacks.

For example, a power supply voltage Vdd is supplied to the stacked bodies STC1 and STC2 via a common interconnect. On the other hand, the stacked bodies STC1 and STC2 are connected to an external circuit (not illustrated) via separated interconnects and separated logic chips 30.

The stacked body STC1 is connected to the logic chip 30 via a connection conductor BCP1, and is connected to the external circuit via an interconnect ICL1. The connection conductor BCP1 includes, for example, the via contact 35 of the semiconductor chip 10 positioned at the lowermost layer of the stacked body STC1 (referring to FIG. 2). The interconnect ICL1 includes, for example, the interconnect (not illustrated) formed at the top surface of the wiring board 20 and the interconnect 11 provided at the first surface BP1 of the base member BP.

The stacked body STC2 is connected to another logic chip 30 via a connection conductor BCP2, and is connected to the external circuit via an interconnect ICL2. The connection conductor BCP2 includes, for example, the via contact 35 of the semiconductor chip 10 positioned at the lowermost layer of the stacked body STC2 (referring to FIG. 2). The interconnect ICL2 includes, for example, other interconnects 11 and other interconnects (not illustrated) formed at the top surface of another wiring board 20.

In other words, the stacked bodies STC1 and STC2 are connected to the external circuit via independent paths. Such a configuration is effective in the case where the signal bands for transmitting and receiving data and commands between the external circuit and the logic chips 30 are narrower than the signal band capable of performing operations of the stacked bodies STC1 and STC2 as a single memory stack.

Figure 4A:
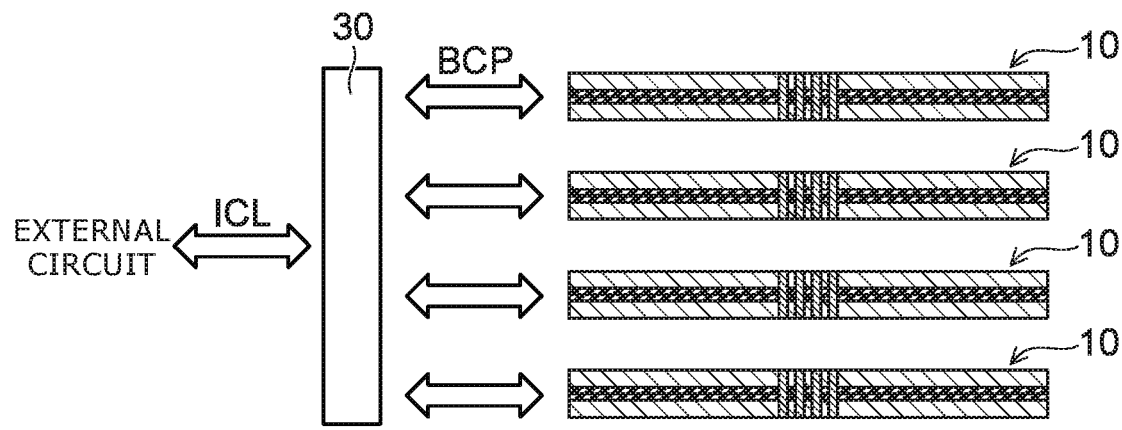
FIGS. 4A and 4B are schematic views showing a connection method between an external circuit and the semiconductor chips.
Figure 4B:
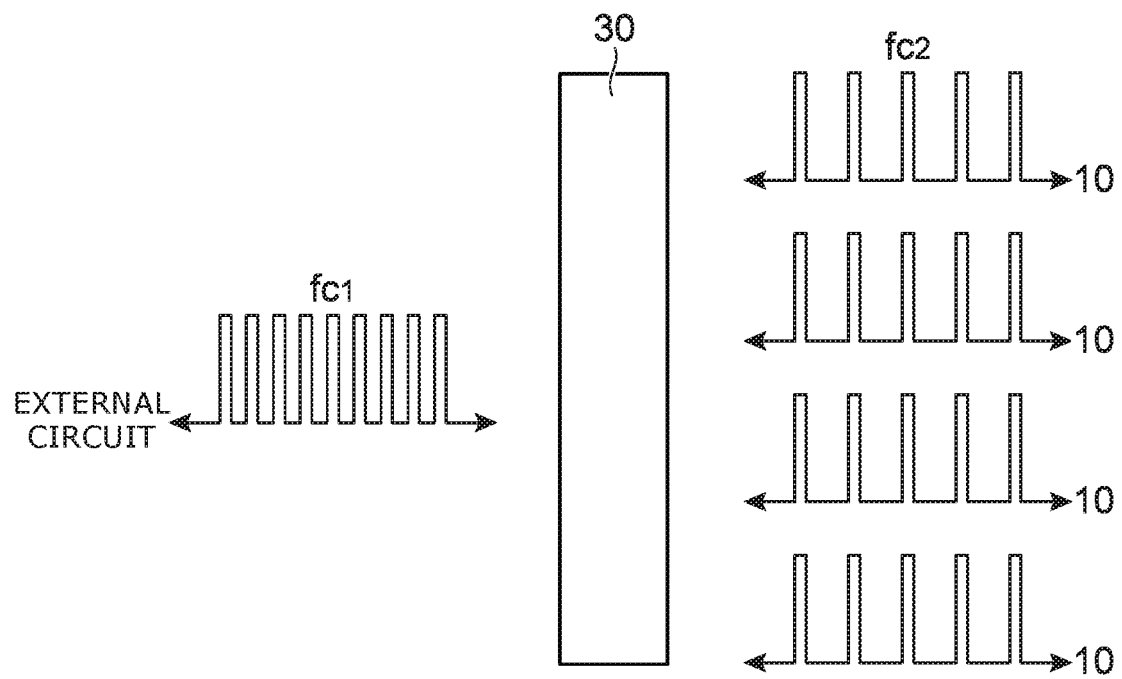

FIGS. 4A and 4B are schematic views showing the connection method between the semiconductor chips 10 and the external circuit via the logic chip 30. FIG. 4A is a schematic view showing the connection path between the semiconductor chips 10 and the external circuit. FIG. 4B is a schematic view showing signals transmitted and received between the semiconductor chips 10 and the external circuit.

As shown in FIG. 4A, the logic chip 30 and the external circuit are connected by an interconnect ICL; and the logic chip 30 is connected to the semiconductor chips 10 respectively by connection conductors BCP. The interconnect ICL is one of an interconnect ICL1 or ICL2 shown in FIG. 3.

The semiconductor chips 10 are connected in parallel with each other to the logic chip 30. In the example, the logic chip 30 and the multiple semiconductor chips 10 are connected via multiple connection conductors BCP. Each of the connection conductors BCP connects one semiconductor chip to the logic chip 30.

The connection conductors BCP are conductors extending in the Z-direction through the interior of the stacked body STC1 or STC2. For example, the connection conductor BCP is configured to include at least one of the connection bump 17, the via contacts 35 and 37, or the contact pad 39 (referring to FIG. 2). Each of the semiconductor chips 10 may be electrically connected to the logic chip 30 via an interconnect (not illustrated) provided on the wiring board 20 and the connection conductor BCP (referring to FIG. 1).

In such a case, the logic chip 30 distributes the commands and the data transmitted from the external circuit to the interface circuits of the semiconductor chips 10, and integrates the data received from the semiconductor chips 10, and outputs to the external circuit.

As shown in FIG. 4B, a frequency fc1 of the signal transmitted and received between the logic chip 30 and the external circuit is higher than a frequency fc2 of the signal transmitted and received between the logic chip 30 and each of the semiconductor chips. For example, the logic chip 30 includes a buffer memory, and converts the frequencies of the input/output signals.

Figure 5:
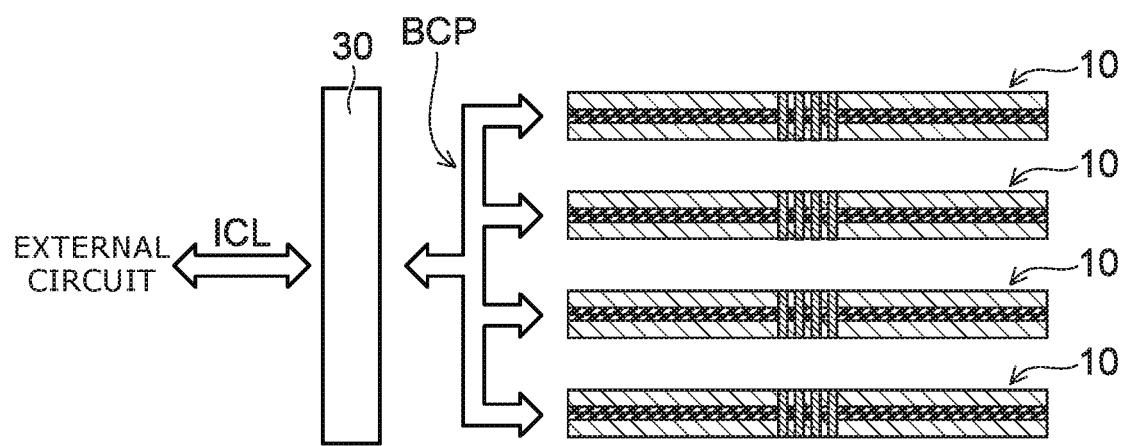
FIG. 5 is a schematic view showing another connection method between the external circuit and the semiconductor chips.

FIG. 5 is a schematic view showing another connection method between the external circuit and the semiconductor chips 10. In the example, the logic chip 30 is connected to the multiple semiconductor chips 10 via one connection conductor BCP.

For example, the logic chip 30 transmits and receives the data via the one connection conductor BCP to and from the multiple semiconductor chips 10 stacked on the wiring board 20. Alternatively, a connection conductor BCP that links the logic chip 30 to two or more semiconductor chips 10 may be multiply arranged between the logic chip 30 and the multiple semiconductor chips 10.

The stacked structure of the semiconductor chips 10 shown in FIG. 2 and the connection ways between the logic chip 30 and the semiconductor chips 10 shown in FIG. 4A, FIG. 4B, and FIG. 5 are applicable also to the embodiments recited below.

Second Embodiment

Figure 6A:
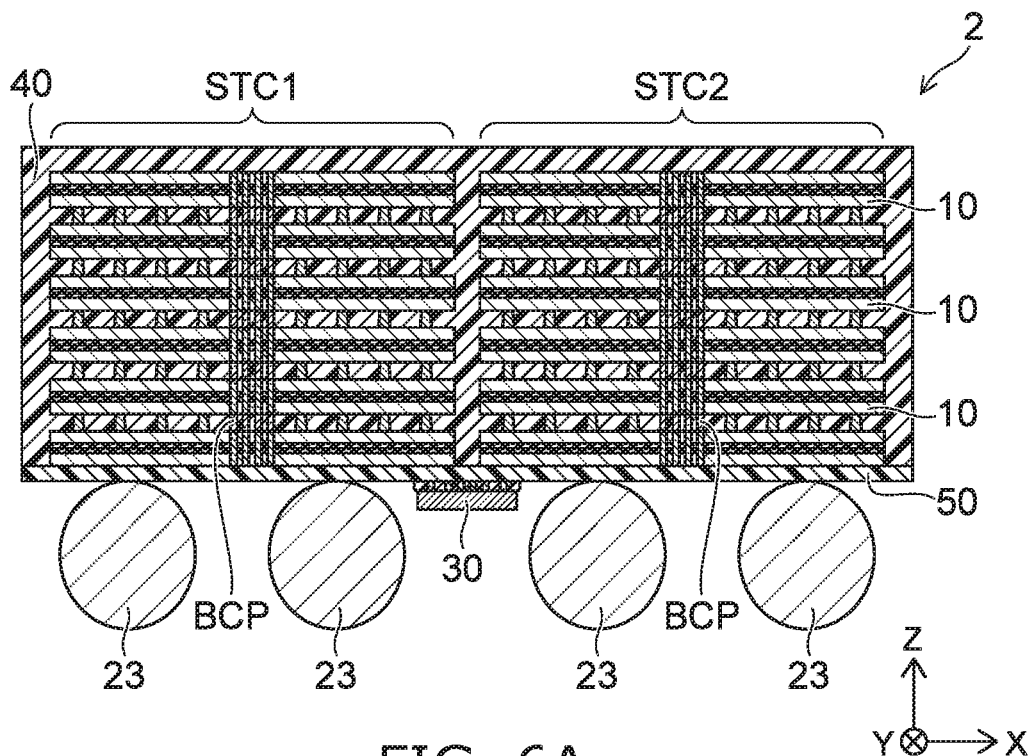
FIGS. 6A and 6B are schematic cross-sectional views showing semiconductor devices according to a second embodiment.
Figure 6B:
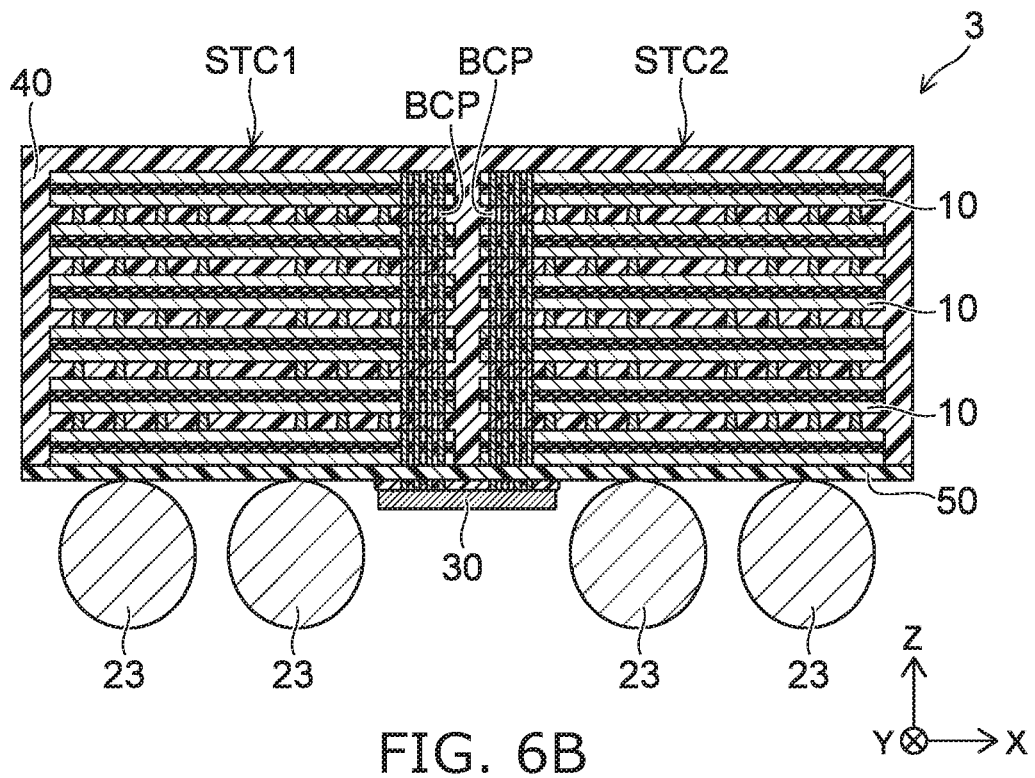
Figure 7:
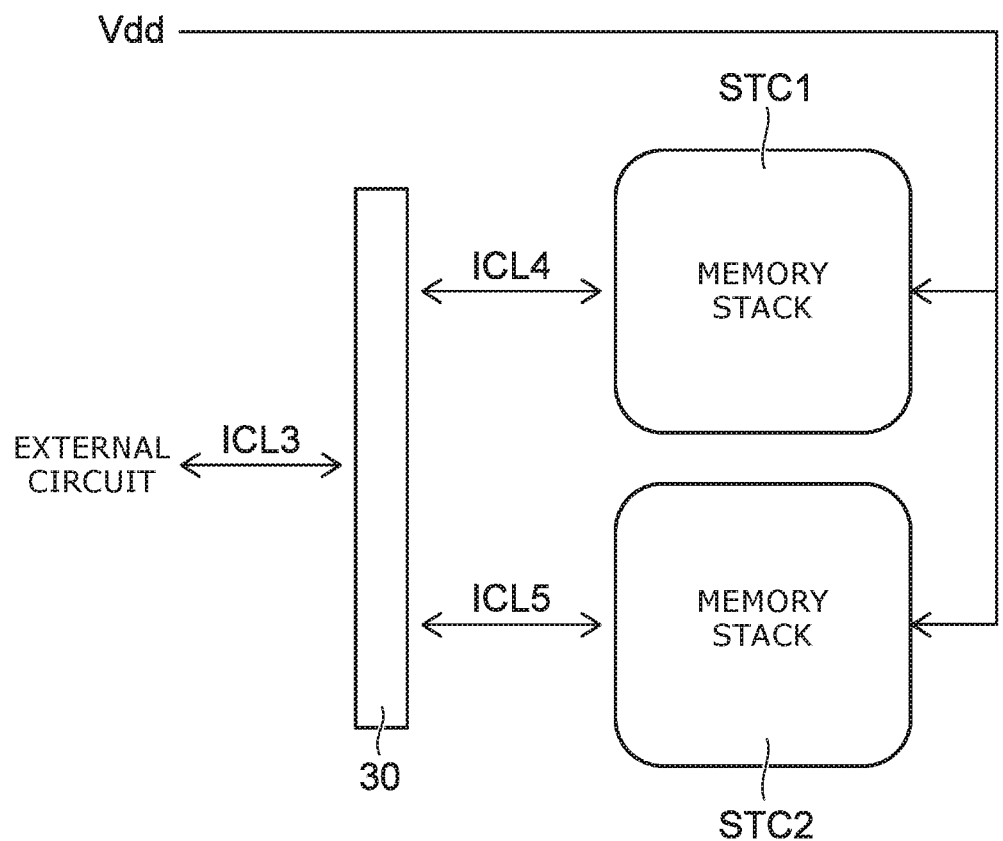
FIG. 7 is a schematic view showing a configuration of the semiconductor devices according to the second embodiment.
Figure 8:
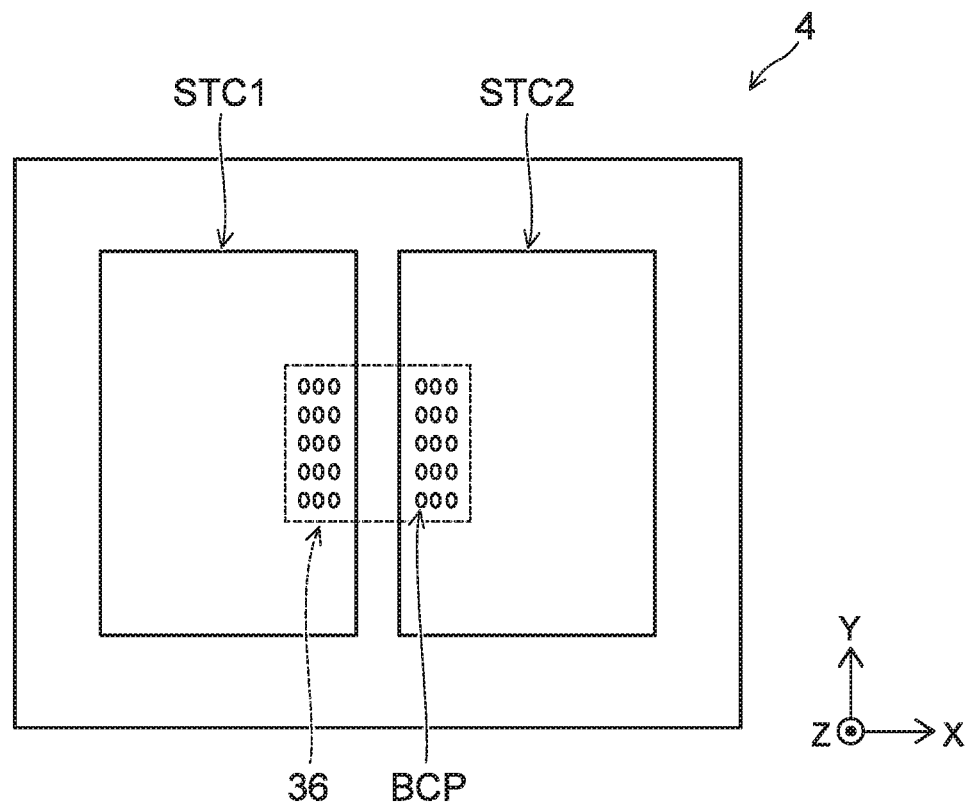
FIG. 8 is a schematic plan view showing a positional relationship between a logic chip and a stacked body of semiconductor chips.

FIGS. 6A and 6B are schematic cross-sectional views showing semiconductor devices 2 and 3 according to a second embodiment. FIG. 7 is a schematic view showing the configuration of the semiconductor devices 2 and 3 according to the second embodiment. FIG. 8 is a schematic plan view showing the positional relationship between the logic chip 30 and the stacked bodies STC1 and STC2 of the semiconductor chips.

The semiconductor devices 2 and 3 include the stacked body STC1, the stacked body STC2, the logic chip 30, and a wiring board 50. The stacked bodies STC1 and STC2 are disposed on the top surface of the wiring board 50 and each include the multiple semiconductor chips 10. The logic chip 30 is disposed on the back surface of the wiring board 50. For example, the stacked bodies STC1 and STC2 may be mounted on the wiring board 50 via FC bumps (referring to FIG. 1).

Figure 9:
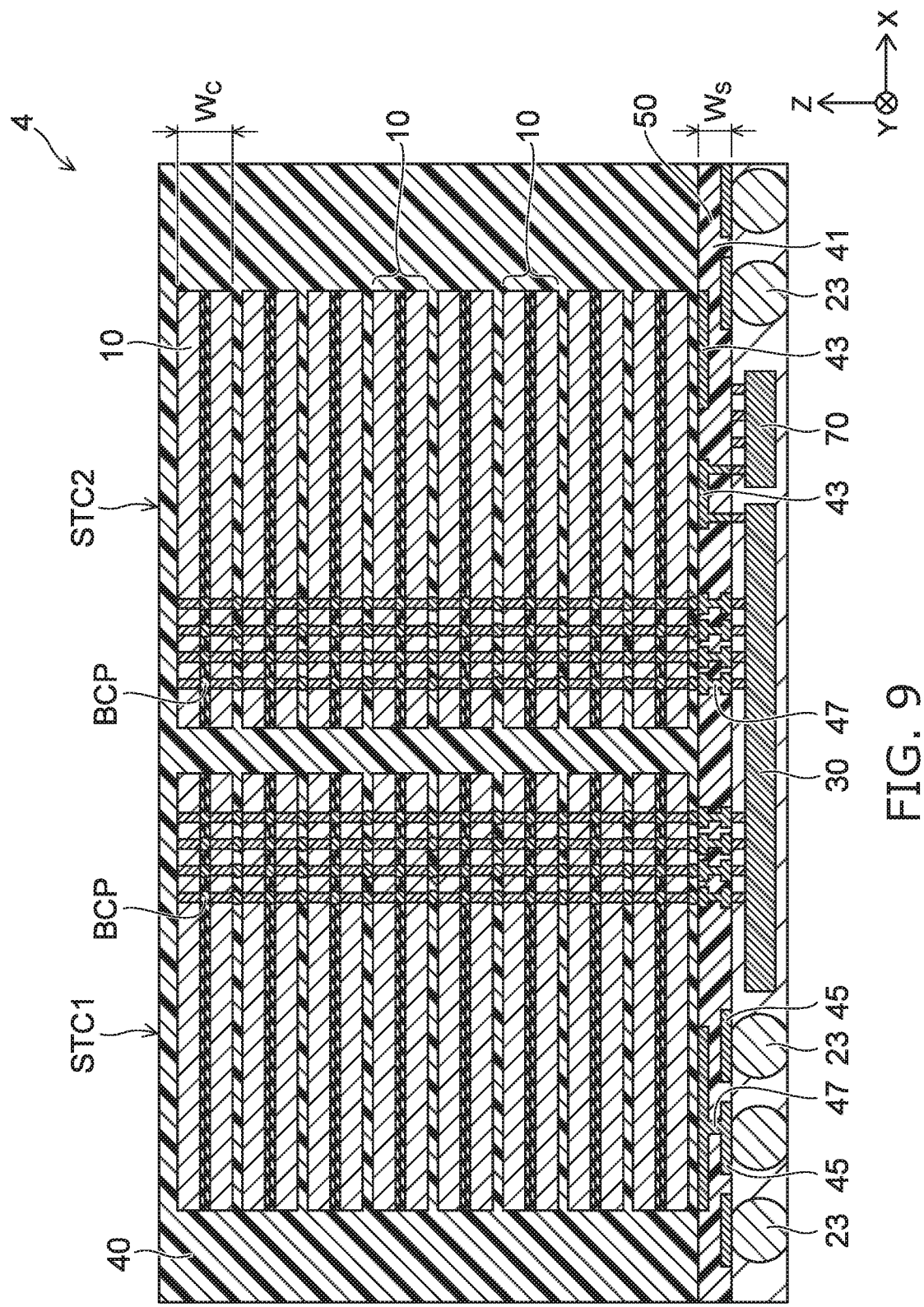
FIG. 9 is a schematic cross-sectional view showing another semiconductor device according to the second embodiment.

The wiring board 50 includes, for example, a resin layer 41, at least one interconnect 43, and a contact pad 45 (referring to FIG. 9). The at least one interconnect 43 is provided at the top surface of the resin layer 41; and the contact pad 45 is provided at the back surface of the resin layer 41. For example, the at least one interconnect 43 and the contact pad 45 are electrically connected by a via contact 47 extending through the resin layer 41.

As shown in FIG. 6A, the solder balls 23 and the logic chip 30 are disposed at the back surface of the wiring board 50. The solder balls 23 and the logic chip 30 are connected to the interconnects provided at the top surface of the wiring board 50 by contact pads and via contacts. The logic chip 30 is disposed to overlap both the stacked bodies STC1 and STC2 when viewed from the Z-direction (referring to FIG. 8).

Interconnects ICL3, ICL4, and ICL5 shown in FIG. 7 are provided at the upper surface of the wiring board 50. For example, the external circuit is connected to the interconnect ICL3 via the solder ball 23. The interconnect ICL3 is further connected to the logic chip 30. In other words, the logic chip 30 transmits and receives the signals to and from the external circuit via the interconnect ICL3.

The stacked body STC1 transmits and receives the signals to and from the logic chip 30 via the interconnect ICL4. The stacked body STC2 transmits and receives the signals to and from the logic chip 30 via the interconnect ICL5. The interconnects ICL4 and ICL5 are connected respectively to the connection conductors BCP of the stacked bodies STC1 and STC2.

As shown in FIG. 6B, the connection conductors BCP of the stacked bodies STC1 and STC2 may be disposed above the logic chip 30. For example, as shown in FIG. 8, the logic chip 30 is disposed to overlap both the stacked bodies STC1 and STC2 when viewed from the Z-direction. Then, the connection conductors BCP extend in the Z-direction above the logic chip 30.

Thus, it is possible to shorten the interconnects ICL4 and ICL5 by disposing the connection conductors BCP above the logic chip 30; and the transmission speed of the signals between the logic chip 30 and the semiconductor chips 10 can be increased.

FIG. 9 is a schematic cross-sectional view showing another semiconductor device 4 according to the second embodiment. The semiconductor device 4 includes the stacked body STC1, the stacked body STC2, the logic chip 30, the wiring board 50, and a memory chip 70. The stacked bodies STC1 and STC2 are disposed at the top surface of the wiring board 50; and the logic chip 30 and the memory chip 70 are disposed at the back surface of the wiring board 50.

As shown in FIG. 9, the wiring board 50 includes the resin layer 41, the interconnect 43, and the contact pad 45. The interconnect 43 is provided at the upper surface of the resin layer 41; and the contact pad 45 is provided at the back surface of the resin layer 41. For example, the interconnect 43 and the contact pad 45 are electrically connected by the via contact 47 extending through the resin layer 41. A thickness $W_S$ in the Z-direction of the wiring board 50 is, for example, thinner than a thickness $W_C$ in the Z-direction of the semiconductor chip 10.

The logic chip 30 is disposed to overlap both the stacked bodies STC1 and STC2 when viewed from the Z-direction (referring to FIG. 8). The connection conductors BCP of the stacked bodies STC1 and STC2 are disposed above the logic chip 30. The connection conductors BCP are connected to the logic chip 30 by the via contacts 47 extending through the wiring board 50.

The memory chip 70 is connected to the logic chip 30 via the interconnect 43 provided at the top surface of the wiring board 50. The memory chip 70 functions as a buffer memory of the logic chip 30.

The wiring board 50 is not limited to the examples recited above, and may be, for example, a so-called interposer in which multiple interconnect layers are stacked.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, the device comprising:
   a base member having a first surface and a second surface, the second surface being on a side opposite to the first surface, the base member including at least one interconnect extending in a first direction along the first surface;
   two or more stacked bodies arranged in the first direction on the first surface, each of the two or more stacked bodies including a plurality of semiconductor chips stacked in a second direction perpendicular to the first surface;
   two or more logic chips electrically connected respectively to the stacked bodies; and
   a resin member over the first surface of the base member, the resin member sealing the two or more stacked bodies and the two or more logic chips on the base member, the resin member physically contacting the first surface of the base member,
   each of the plurality of semiconductor chips including a first semiconductor layer and a second semiconductor layer,
   the first semiconductor layer and the second semiconductor layer each having an element surface and a back surface, an active element being provided on the element surface, the back surface being on a side opposite to the element surface, and the first semiconductor layer and the second semiconductor layer being bonded such that the element surface of the second semiconductor layer faces the element surface of the first semiconductor layer.

2. The device according to claim 1, wherein the base member includes an interconnect electrically connecting one of the logic chips and one of the stacked bodies.

3. The device according to claim 1, wherein
   the stacked body includes connection conductors electrically connected to the logic chip, and
   the connection conductors electrically connect the logic chip to the plurality of semiconductor chips respectively.

4. The device according to claim 1, wherein
   the stacked body includes a connection conductor electrically connected to the logic chip, and
   the connection conductor is shared by the plurality of semiconductor chips and electrically connects the plurality of semiconductor chips and the logic chip.

5. The device according to claim 1, further comprising a wiring board disposed on the first surface of the base member,
   the plurality of semiconductor chips being stacked on the wiring board,
   one of the logic chips being disposed between the base member and the wiring board.

6. The device according to claim 5, further comprising a bonding bump connecting the wiring board and the base member,
   the stacked body provided on the wiring board being electrically connected to the interconnect of the base member via the wiring board and the bonding bump.

7. The device according to claim 1, further comprising a bonding bump provided on the second surface of the base member,
   the bonding bump being electrically connected to one of the logic chips via the interconnect.

8. The device according to claim 1, wherein
   each of the plurality of semiconductor chips includes a first structure body and a second structure body, the first structure body being provided on the element surface of the first semiconductor layer, and the second structure body being provided on the element surface of the second semiconductor layer, and
   a first spacing between the first structure body and the second structure body is narrower than a second spacing between semiconductor chips of a plurality of the semiconductor chips adjacent to each other in the second direction.

9. The device according to claim 8, wherein
   each of the stacked bodies further includes a connection bump provided between the adjacent semiconductor chips, and
   the first structure body and the second structure body each include a contact pad, the first semiconductor layer and the second semiconductor layer being bonded via the contact pads.

10. A semiconductor device, the device comprising:
    a base member having a first surface and a second surface, the second surface being on a side opposite to the first surface, the base member including at least one interconnect extending in a first direction along the first surface;
    two or more stacked bodies arranged in the first direction on the first surface, the two or more stacked bodies including a plurality of semiconductor chips stacked in a second direction perpendicular to the first surface; and
    a logic chip provided on the second surface of the base member and electrically connected to the two or more stacked bodies,
    the plurality of semiconductor chips each including a first semiconductor layer and a second semiconductor layer,
    the first semiconductor layer and the second semiconductor layer each having an element surface and a back surface, an active element being provided on the element surface, the back surface being on a side opposite to the element surface, and the first semiconductor layer and the second semiconductor layer being bonded such that the element surface of the second semiconductor layer faces the element surface of the first semiconductor layer,
    the logic chip being provided at a position overlapping two stacked bodies of the two or more stacked bodies when viewed from the second direction, the two stacked bodies being disposed to be adjacent to each other, the two stacked bodies each including a connection conductor, the connection conductor extending in the second direction and being electrically connected to the logic chip, the connection conductors being provided only at positions overlapping the logic chip when viewed from the second direction, the connection conductors being provided in the two stacked bodies only other than center portions of the two stacked bodies.

11. The device according to claim 10, wherein the base member includes a via contact provided between the logic chip and the connection conductors, and one of the connection conductors is connected to the logic chip by the via contact.

12. The device according to claim 10, wherein a thickness in the second direction of the base member is thinner than a thickness in the second direction of the semiconductor chip.

13. The device according to claim 10, further comprising a memory chip provided on the second surface of the base member, and electrically connected to the logic chip.

14. The device according to claim 10, further comprising a resin member covering the logic chip and being provided on the second surface of the base member.

15. The device according to claim 10, further comprising a bonding bump provided on the second surface of the base member, a thickness in the second direction of the bonding bump being thicker than a thickness in the second direction of the logic chip.

16. The device according to claim 15, wherein the base member includes a via contact connected to the interconnect, and the bonding bump is connected to the interconnect by the via contact.

* * * * *